United States Patent
Hang et al.

(10) Patent No.: US 8,927,428 B2
(45) Date of Patent: Jan. 6, 2015

(54) PROCESS OF FORMING AN ALUMINUM P-DOPED SURFACE REGION OF AN N-DOPED SEMICONDUCTOR SUBSTRATE

(71) Applicant: E I du Pont de Nemours and Company, Wilmington, DE (US)

(72) Inventors: Kenneth Warren Hang, Hillsborough, NC (US); Alistair Graeme Prince, Bristol (GB); Michael Rose, South Gloucestershire (GB); Richard John Sheffield Young, Somerset (GB)

(73) Assignee: E I du Pont de Nemours and Company, Wilmington, DE (US)

( * ) Notice: Subject to any disclaimer, the term of this patent is extended or adjusted under 35 U.S.C. 154(b) by 99 days.

(21) Appl. No.: 13/667,054

(22) Filed: Nov. 2, 2012

(65) Prior Publication Data
US 2013/0112251 A1 May 9, 2013

Related U.S. Application Data

(60) Provisional application No. 61/555,519, filed on Nov. 4, 2011.

(51) Int. Cl.
| | | |
|---|---|---|
| *H01L 21/44* | (2006.01) | |
| *H01L 21/00* | (2006.01) | |
| *H01L 31/0224* | (2006.01) | |
| *H01L 31/0288* | (2006.01) | |
| *H01L 31/068* | (2012.01) | |
| *H01L 31/18* | (2006.01) | |

(52) U.S. Cl.
CPC ...... *H01L 31/02245* (2013.01); *H01L 31/0288* (2013.01); *H01L 31/068* (2013.01); *H01L 31/1804* (2013.01); *Y02E 10/547* (2013.01)
USPC ......... 438/688; 438/96; 438/97; 257/E23.018

(58) Field of Classification Search
CPC ............... H01L 31/022425; H01L 31/1804; H01L 31/068; H01B 1/22; H01B 1/16; Y02E 10/50; Y02E 10/547; H01I 31/1804; H01I 31/06
USPC .............. 438/96, 97, 688; 257/E23.018
See application file for complete search history.

(56) References Cited

U.S. PATENT DOCUMENTS

| | | | |
|---|---|---|---|
| 2005/0268963 A1* | 12/2005 | Jordan et al. | 136/256 |
| 2006/0231802 A1* | 10/2006 | Konno | 252/500 |
| 2007/0221270 A1 | 9/2007 | Watsuji et al. | |
| 2009/0255583 A1 | 10/2009 | Young et al. | |
| 2010/0163101 A1 | 7/2010 | Kumar et al. | |

OTHER PUBLICATIONS

Corresponding case PCT/US2012/063547, International Search Report, European Patent Office, Rijswijk, NL, Authorized Officer, Mauro Boero, Dec. 17, 2012.
Clement et al, Industrially feasible multi-crystalline metal wrap through (MWT) silicon solar cells exceeding 16% efficiency, Solar Energy Materials & Solar Cells 93 (2009), pp. 1051-1055).
Solland Preliminary Datasheet Sunweb downloaded from website http://www.sollandsolar.com/IManager/Content/4680/gfl7/mt1537/mi30994/mu1254913665/mv2341, (2002).

* cited by examiner

*Primary Examiner* — Michelle Mandala

(57) ABSTRACT

A process for the formation of at least one aluminum p-doped surface region of an n-type semiconductor substrate comprising the steps:
(1) providing an n-type semiconductor substrate,
(2) applying and drying an aluminum paste on at least one surface area of the n-type semiconductor substrate,
(3) firing the dried aluminum paste, and
(4) removing the fired aluminum paste with water,
wherein the aluminum paste employed in step (2) includes particulate aluminum, an organic vehicle and 3 to 20 wt. % of glass frit, based on total aluminum paste composition.

12 Claims, No Drawings

PROCESS OF FORMING AN ALUMINUM P-DOPED SURFACE REGION OF AN N-DOPED SEMICONDUCTOR SUBSTRATE

FIELD OF THE INVENTION

The invention is directed to a process of forming an aluminum p-doped surface region of an n-doped semiconductor substrate and to semiconductor substrates made by said process.

TECHNICAL BACKGROUND OF THE INVENTION

In the description and the claims the term "aluminum p-doped" is used. It means p-doped with aluminum as the p-dopant.

The p-doping of n-type silicon by thermal diffusion of a p-dopant like boron into an n-type silicon substrate is well-known. Thermal diffusion is typically carried out using a diffusion source of the p-dopant, for example, gaseous $BBr_3$. The p-dopant may be thermally diffused into a surface region of the n-type silicon substrate thus forming a thin p-doped layer with a low penetration depth of, for example, up to 200 nm. Said thermal diffusion process can be supported by masking certain portions of the n-type silicon substrate surface, i.e. those surface areas which shall not receive the p-dopant.

A solar cell is a particular example of a semiconductor.

A conventional solar cell structure consists of a p-type base with a front n-type surface (front n-type region, front n-type emitter), a negative electrode that is deposited on the front-side (illuminated side, illuminated surface) of the cell and a positive electrode on the back-side. Typically, the p-type base with the front n-type surface is p-type silicon with a front n-type silicon surface.

Alternatively, a reverse solar cell structure with an n-type base (n-type solar cell) is also known. Such cells have a front p-type surface (front p-type region, front p-type emitter) with a positive electrode on the front-side and a negative electrode to contact the back-side of the cell. Typically, the n-type base with the front p-type surface is n-type silicon with a front p-type silicon surface.

Other recent solar cell design concepts also include n-type bases, typically n-type silicon bases, wherein heterojunction p-type emitters are formed locally on the back surface of the solar cells. Here, positive as well as negative electrodes are located on the back-side of the solar cell.

n-Type solar cells can in theory produce absolute efficiency gains of up to 1% compared to p-type solar cells owing to the reduced recombination velocity of electrons in the n-doped semiconductor substrate.

The production of an n-type solar cell typically starts with the formation of an n-type substrate in the form of an n-type wafer, typically an n-type silicon wafer. To this end, an n-doped base is typically formed via thermal diffusion of a phosphorus containing precursor such as $POCl_3$ into the wafer. The n-type wafer may have an area in the range of, for example, 100 to 250 $cm^2$ and a thickness of, for example, 180 to 300 µm. On the n-type wafer one or more p-type emitters are formed via thermal diffusion of a boron containing precursor such as $BBr_3$. The resulting p-type emitter(s) are either formed as a p-type emitter over the entire front-side surface of the n-type wafer, or as local p-type heterojunctions on the back surface. The p-n junction is formed where the concentration of the n-type dopant equals the concentration of the p-type dopant.

A dielectric layer, for example, of $TiO_x$, $SiO_x$, $TiO_x/SiO_x$, $SiN_x$, $Si_3N_4$ or, in particular, a dielectric stack of $SiN_x/SiO_x$ is then typically formed on the wafer to a thickness of, for example, 80 to 150 nm by a process, such as, for example, plasma CVD (chemical vapor deposition). Such a layer serves as an ARC (antireflection coating) layer and/or as a passivation layer.

A solar cell structure with an n-type base has one or more positive electrodes (either one on the front-side or one or more positive electrodes on the back-side) and a negative electrode on the back-side. The anode(s) is/are applied (typically by screen printing) from a conductive metal paste, typically a silver paste, and then dried and fired. A front anode is typically in the form of a grid or a so-called H pattern which includes (i) thin parallel finger lines (collector lines) and (ii) two busbars intersecting the finger lines at right angle. In addition, a conductive metal back cathode, typically a silver back cathode, is formed over portions of the back-side for interconnecting solar cells. To this end, a conductive metal paste, typically a silver paste, is applied (typically by screen printing) and successively dried on the back-side of the substrate. Normally, the back-side conductive metal paste is applied onto the n-type wafer's back-side as a grid, for example, an H pattern grid, or as two parallel busbars or as rectangles (tabs) ready for soldering interconnection strings (presoldered copper ribbons). The back-side conductive metal paste is fired becoming a back cathode. Firing is typically carried out in a belt furnace for a period of 1 to 5 minutes with the wafer reaching a peak temperature in the range of 700 to 900° C. The front anode and the back cathode can be fired sequentially or cofired.

MWT (metal-wrap-through) solar cells represent a special type of the aforedescribed solar cells. They have another cell design and they are also well-known to the skilled person (cf. for example, the website "http://www.sollandsolar.com/IManager/Content/4680/qfl7/mt1537/mi30994/mu1254913665/mv2341" and the leaflet "Preliminary Datasheet Sunweb" which can be downloaded from that website and F. Clement et al., "Industrially feasible multi-crystalline metal wrap through (MWT) silicon solar cells exceeding 16% efficiency", Solar Energy Materials & Solar Cells 93 (2009), pages 1051-1055). MWT solar cells are back contact cells allowing for less front-side shadowing than standard solar cells.

Just like in case of the standard solar cells mentioned above, MWT solar cells can be produced as MWT solar cells having a p-type base (p-type MWT solar cells) or, in the alternative, as MWT solar cells having an n-type base (n-type MWT solar cells). Typically, the base material is silicon.

n-Type MWT solar cell wafers are provided with small holes forming vias between the front- and the back-side of the cell. The n-type MWT solar cells have a p-type emitter extending over the entire front-side and the inside of the holes. The p-type emitter is covered with a dielectric passivation layer which serves as an ARC layer, as is conventional for solar cells. Whereas the p-type emitter extends not only over the entire front-side but also over the inside of the holes, the dielectric passivation layer does not and leaves out the inside of the holes. The inside of the holes, i.e. the p-type diffusion layer not covered with the dielectric passivation layer, is provided with a metallization. The metallizations of the holes serve as emitter contacts and form anodic back contacts of the n-type MWT solar cell. In addition, the front-side of the n-type MWT solar cell is provided with a front-side metallization in the form of thin conductive metal collector lines which are arranged in a pattern typical for MWT solar cells, for-example, in a grid- or web-like pattern or as thin parallel finger lines. The term "pattern typical for MWT solar cells" means that the terminals of the collector lines overlap with the metallizations of the holes and are thus electrically connected therewith. The collector lines are applied from a conductive metal paste and they are fired through the front-side dielectric passivation layer thus making contact with the front p-type surface of the n-type MWT solar cell wafer.

The back-side of an n-type MWT solar cell is provided with cathodic conductive metal collector back contacts, which are in any case electrically insulated from the metallizations of the holes. The photoelectric current is collected from the anodic back contacts and the cathodic conductive metal collector back contacts of the n-type MWT solar cell.

Similar to the production of a standard solar cell of the reverse type mentioned above, the production of an n-type MWT solar cell starts with the formation of an n-type substrate in the form of an n-type wafer, typically an n-type silicon wafer. To this end, an n-doped base is typically formed via thermal diffusion of a phosphorus containing precursor such as $POCl_3$ into the undoped wafer. Small holes forming vias between the front- and the back-side of the wafer are applied, typically by laser drilling. The holes so produced are evenly distributed over the wafer and their number lies in the range of, for example, 10 to 100 per wafer. Then a p-type diffusion layer (p-type emitter) is formed, typically via thermal diffusion of a boron containing precursor such as $BBr_3$. The p-type diffusion layer is formed over the entire front surface of the n-type wafer including the inside of the holes. The p-n junction is formed where the concentration of the n-type dopant equals the concentration of the p-type dopant.

After formation of the p-type diffusion layer, excess surface glass is removed from the emitter surface by etching, in particular, in a strong acid like, for example, hydrofluoric acid.

Typically, a dielectric ARC layer, for example, of $TiO_x$, $SiO_x$, $TiO_x/SiO_x$, $SiN_x$, $Si_3N_4$ or, in particular, a dielectric stack of $SiN_x/SiO_x$ is then formed on the front-side p-type diffusion layer leaving out however the inside of the holes and, optionally, also a narrow rim around the front-side edges of the holes. Deposition of the dielectric may be performed to a thickness of, for example, 50 to 100 nm by a process such as plasma CVD (chemical vapor deposition) or sputtering.

Just like a standard solar cell structure with an n-type base, n-type MWT solar cells typically have a positive electrode on their front-side and a negative electrode on their back-side. The front anode takes the form of thin conductive collector lines arranged in a pattern typical for MWT solar cells. The thin conductive collector lines are typically applied by screen printing, drying and firing a conductive metal paste, typically a silver paste, on the ARC layer on the front-side of the cell, whereby the terminals of the collector lines overlap with the metallizations of the holes to enable electric connection therewith. Firing is typically carried out in a belt furnace for a period of 1 to 5 minutes with the wafer reaching a peak temperature in the range of 700 to 900° C.

As already mentioned, the holes of the n-type MWT solar cell wafers are provided with metallizations. To this end, the holes themselves are metallized by applying conductive metal paste to the holes, either in the form of a conductive metal layer (open holes) or in the form of conductive metal plugs (holes filled with conductive metal). The metallizations may cover only the inside of the holes or also a narrow rim around the edges of the holes, whereby the narrow rim may be present on the front-side edges of the holes, on the back-side edges of the holes or on both. The metallizations may be applied from one single conductive metal paste. It is also possible to apply the metallizations from two different conductive metal pastes, i.e. one conductive metal paste may be applied to the front-side of the holes and the other to their back-side. After application of the one or two conductive metal pastes it is/they are dried and fired to form p-type emitter contacts and, respectively, anodic back contacts of the n-type MWT solar cell. Firing is typically carried out in a belt furnace for a period of 1 to 5 minutes with the wafer reaching a peak temperature in the range of 700 to 900° C. The fired metallizations of the holes are in electric connection with the terminals of the thin front-side conductive collector lines.

In addition, a back-side conductive metal paste, typically a silver paste, is applied, typically screen printed, and successively dried on the back-side of the n-type wafer avoiding any contact with the metallizations of the holes. In other words, the back-side conductive metal paste is applied ensuring that it stays electrically insulated from the metallizations of the holes prior to as well as after firing. The back-side conductive metal paste is applied evenly distributed over the back-side of the n-type substrate, then dried and transformed by firing to become evenly distributed cathodic conductive metal back collector contacts. Firing is typically carried out in a belt furnace for a period of 1 to 5 minutes with the wafer reaching a peak temperature in the range of 700 to 900° C. The front anode, the metallizations of the holes and the back cathodes can be fired sequentially or cofired. The conductive metal back collector contacts account only for a small area of the back-side of the n-type substrate. In addition, the front-side conductive metal paste applied as thin collector lines fires through the ARC layer during firing, and is thereby able to electrically contact the front-side p-type emitter.

SUMMARY OF THE INVENTION

It has been found that an aluminum p-doped surface region of an n-doped semiconductor substrate can be produced by applying and firing an aluminum paste on the surface of an n-doped semiconductor substrate and subsequent removal of the fired aluminum composition by treatment with water, provided the aluminum paste includes 3 to 20 wt. % (weight-%) of glass frit, based on total aluminum paste composition.

In the description and the claims the term "semiconductor substrate" is used. It means thin semiconductor wafers, in particular, solar cell wafers. To avoid misunderstandings, it does not include thick substrates like, for example, crystalline silicon ingots.

The invention relates to a process for the formation of at least one aluminum p-doped surface region of an n-type semiconductor substrate. Accordingly, it relates also to a process for the production of the n-type semiconductor substrate itself which has the at least one aluminum p-doped surface region. Therefore, in its general embodiment, the process of the invention includes the steps:

(1) providing an n-type semiconductor substrate,
(2) applying and drying an aluminum paste on at least one surface area of the n-type semiconductor substrate,
(3) firing the dried aluminum paste, and
(4) removing the fired aluminum paste with water, wherein the aluminum paste employed in step (2) includes particulate aluminum, an organic vehicle and 3 to 20 wt. % of glass frit, based on total aluminum paste composition.

DETAILED DESCRIPTION OF THE INVENTION

In the description and the claims the term "aluminum p-doped surface region of an n-type semiconductor substrate" is used. It is not limited to a surface area of an n-type semiconductor substrate where the aluminum p-dopant can only be found at the very surface; rather, it means a surface area of an n-type semiconductor substrate where the aluminum p-dopant has penetrated the surface in the respective area only to a certain penetration depth in the range of, for example, 500 to 4000 nm, in particular, 3000 to 4000 nm; in other words, the aluminum p-dopant forms a thin aluminum p-doped surface layer in the respective area. In any case the aluminum p-dopant has not penetrated throughout the entire n-type semiconductor substrate.

In the description and the claims the term "at least one surface area of an n-type semiconductor substrate" is used. It means either the entire surface area or only a portion thereof, for example, only one side of two or more sides of the n-type semiconductor substrate or even only a portion of a side thereof. An example of a portion of a side is a pattern covering only a portion of a side.

In step (1) of the process of the invention an n-type semiconductor substrate is provided. For example, the n-type semiconductor substrate may be selected from the group consisting of semiconductor substrates of n-doped crystalline germanium and semiconductor substrates of n-doped crystalline germanium-silicon alloy. The n-type semiconductor substrate may in particular be selected from the group consisting of semiconductor substrates of n-doped crystalline silicon.

The term "crystalline" used in the description and in the claims means mono- or polycrystalline.

The aluminum paste applied in step (2) of the process of the invention is an aluminum thick film conductive composition containing particulate aluminum, an organic vehicle and glass frit, wherein the proportion of the glass frit in the aluminum paste is 3 to 20 wt. %, based on total aluminum paste composition.

The particulate aluminum may be aluminum or, in an embodiment, an aluminum alloy with one or more other metals. In case of the aluminum alloys the aluminum content is, for example, 99.7 to below 100 wt. %. The particulate aluminum may include aluminum particles in various shapes, for example, aluminum flakes, spherical-shaped aluminum powder, nodular-shaped (irregular-shaped) aluminum powder or any combinations thereof. Particulate aluminum, in an embodiment, is in the form of aluminum powder. The aluminum powder exhibits an average particle size of, for example, 4 to 10 μm. The particulate aluminum may be present in the aluminum paste in a proportion of 50 to 80 wt. %, or, in an embodiment, 70 to 75 wt. %, based on total aluminum paste composition.

In the description and the claims the term "average particle size" is used. It shall mean the average particle size (mean particle diameter, d50) determined by means of laser light scattering. Laser light scattering measurements can be carried out making use of a particle size analyzer, for example, a Microtrac S3500 machine.

All statements made in the description and the claims in relation to average particle sizes relate to average particle sizes of the relevant materials as are present in the aluminum paste composition.

The aluminum paste includes an organic vehicle. A wide variety of inert viscous materials can be used as organic vehicle. The organic vehicle may be one in which the particulate constituents (particulate aluminum, glass frit) are dispersible with an adequate degree of stability. The properties, in particular, the rheological properties, of the organic vehicle may be such that they lend good application properties to the aluminum paste composition, including: stable dispersion of insoluble solids, appropriate viscosity and thixotropy for application, appropriate wettability of the semiconductor substrate and the paste solids, a good drying rate, and good firing properties. The organic vehicle used in the aluminum paste may be a nonaqueous inert liquid. The organic vehicle may be an organic solvent or an organic solvent mixture; in an embodiment, the organic vehicle may be a solution of organic polymer(s) in organic solvent(s). In an embodiment, the polymer used for this purpose may be ethyl cellulose. Other examples of polymers which may be used alone or in combination include ethylhydroxyethyl cellulose, wood rosin, phenolic resins and poly(meth)acrylates of lower alcohols. Examples of suitable organic solvents include ester alcohols and terpenes such as alpha- or beta-terpineol or mixtures thereof with other solvents such as kerosene, dibutylphthalate, diethylene glycol butyl ether, diethylene glycol butyl ether acetate, hexylene glycol and high boiling alcohols. In addition, volatile organic solvents for promoting rapid hardening after application of the aluminum paste on the semiconductor substrate can be included in the organic vehicle. Various combinations of these and other solvents may be formulated to obtain the viscosity and volatility requirements desired.

The organic solvent content in the aluminum paste may be in the range of 5 to 25 wt. %, or, in an embodiment, 10 to 20 wt. %, based on total aluminum paste composition.

The organic polymer(s) may be present in the organic vehicle in a proportion in the range of 0 to 20 wt. %, or, in an embodiment, 5 to 10 wt. %, based on total aluminum paste composition.

The aluminum paste includes 3 to 20 wt. % or, in an embodiment, 3 to 10 wt. % of glass frit, based on total aluminum paste composition, as inorganic binder. If the glass frit content in the aluminum paste is less than 3 wt. %, process step (4) cannot successfully be carried out; i.e. in such case the fired aluminum paste cannot or not completely be removed with water. Aluminum paste compositions with a glass frit content exceeding the upper limit of 20 wt. % do not possess other required properties; i.e. aluminum pastes containing more than 20 wt. % of glass frit are generally not useful in the process of the invention.

The glass frit has a softening point temperature in the range of, for example, 350 to 600° C. and an average particle size of, for example, 0.5 to 4 μm.

In the description and the claims the term "softening point temperature" is used. It shall mean the glass transition temperature, determined by differential thermal analysis DTA at a heating rate of 10 K/min.

The 3 to 20 wt. % of glass frit may include one glass frit or a combination of two or more different glass frits. There is no special restriction with regard to the composition of the glass frit. In an embodiment, the glass frit is an aluminosilicate glass. In another embodiment, it is a borosilicate glass which may or may not include alkali oxides and/or alkaline earth oxides. The glass frit may contain PbO or it may be leadfree. Examples of glass frits further include combinations of oxides, such as: $B_2O_3$, $SiO_2$, $Al_2O_3$, CdO, CaO, BaO, ZnO, $Na_2O$, $Li_2O$, PbO, and $ZrO_2$ which may be used independently or in combination to form glass binders.

The preparation of glass frits is well known; the constituents of the glass, in particular in the form of the oxides of the constituents, may be melted together, for example. The batch ingredients may, of course, be any compounds that will yield the desired oxides under the usual conditions of frit production. For example, boric oxide can be obtained from boric acid, barium oxide can be produced from barium carbonate, etc. As is well known in the art, heating may be conducted to a peak temperature in the range of, for example, 1050 to 1250° C. and for a time such that the melt becomes entirely liquid and homogeneous, typically, 0.5 to 1.5 hours. The molten composition is poured into water to form the frit.

The glass may be milled in a ball mill with water or inert low viscosity, low boiling point organic liquid to reduce the particle size of the frit and to obtain a frit of substantially uniform size. It may then be settled in water or said organic liquid to separate fines and the supernatant fluid containing the fines may be removed. Other methods of classification may be used as well.

The aluminum paste may include refractory inorganic compounds and/or metal-organic compounds. "Refractory inorganic compounds" refers to inorganic compounds that are resistant to the thermal conditions experienced during firing. For example, they have melting points above the temperatures experienced during firing. Examples include inorganic oxides, for example, amorphous silicon dioxide. Examples of metal-organic compounds include tin- and zinc-organic compounds such as zinc neodecanoate and tin(II) 2-ethylhexanoate.

The aluminum paste may include one or more organic additives, for example, surfactants, thickeners, rheology modifiers and stabilizers. The organic additive(s) may be part of the organic vehicle. However, it is also possible to add the organic additive(s) separately when preparing the aluminum paste. The organic additive(s) may be present in the aluminum paste in a total proportion of, for example, 0 to 10 wt. %, based on total aluminum paste composition.

The organic vehicle content in the aluminum paste may be dependent on the method of applying the paste and the kind of organic vehicle used, and it can vary. In an embodiment, it may be from 20 to 45 wt. %, or, in an embodiment, it may be in the range of 22 to 35 wt. %, based on total aluminum paste composition. The number of 20 to 45 wt. % includes organic solvent(s), possible organic polymer(s) and possible organic additive(s).

The aluminum paste is a viscous composition, which may be prepared by mechanically mixing the particulate aluminum and the glass frit with the organic vehicle. In an embodiment, the manufacturing method power mixing, a dispersion technique that is equivalent to the traditional roll milling, may be used; roll milling or other mixing technique can also be used.

The aluminum paste can be used as such or may be diluted, for example, by the addition of additional organic solvent(s); accordingly, the weight percentage of all the other constituents of the aluminum paste may be decreased.

In step (2) of the process of the invention, the aluminum paste is applied on at least one surface area of the n-type semiconductor substrate. The aluminum paste may be applied to a dry film thickness of, for example, 15 to 60 μm. The method of aluminum paste application may be printing, for example, silicone pad printing or, in an embodiment, screen printing, or it may be pen-writing. The variety of application methods enables the aluminum paste to be applied to cover the entire surface or only one or more portions thereof. It is possible for example to apply the aluminum paste in a pattern, wherein the pattern may include fine structures like thin lines and dots. If it is desired to apply the aluminum paste in a pattern, there is no need to employ masking means like in conventional p-doping. The application viscosity of the aluminum paste may be, for example, 20 to 200 Pa·s when it is measured at a spindle speed of 10 rpm and 25° C. by a utility cup using a Brookfield HBT viscometer and #14 spindle.

After its application the aluminum paste is dried, for example, for a period of 1 to 100 minutes with the n-type semiconductor substrate reaching a peak temperature in the range of 100 to 300° C. Drying can be carried out making use of, for example, belt, rotary or stationary driers, in particular, IR (infrared) belt driers.

The dried aluminum paste is fired in step (3) of the process of the invention. Firing may be performed, for example, for a period of 1 to 5 minutes with the n-type semiconductor substrate reaching a peak temperature in the range of 700 to 900° C.

Firing can be carried out making use of, for example, single or multi-zone belt furnaces, in particular, multi-zone IR belt furnaces. Firing happens in the presence of oxygen, in particular, in the presence of air. During firing the organic substance including non-volatile organic material and the organic portion not evaporated during the drying step may be removed, i.e. burned and/or carbonized, in particular, burned. The organic substance removed during firing includes organic solvent(s), possible organic polymer(s), possible organic additive(s) and the organic moieties of possible metal-organic compounds. There is a further process taking place during firing, namely sintering of the glass frit. During firing the temperature exceeds the melting point of aluminum; in the typical case of an n-type silicon semiconductor substrate, an aluminum-silicon melt is formed and, subsequently, during the cooling phase, an epitaxially grown layer of silicon is formed that is p-doped with aluminum, namely an aluminum p-doped surface region of the n-type silicon semiconductor substrate.

Typically, there is no remarkable delay between performing process steps (3) and (4), in particular not when the process of the invention is carried out as an industrial process. For example, process step (4) will typically be carried out immediately after or, for example, within 24 hours after the n-type semiconductor substrate has cooled down after conclusion of process step (3). However, the length of time between performing process steps (3) and (4) is not critical and has no influence on a successful performance of the process of the invention.

In step (4) of the process of the invention the fired aluminum paste is removed with water, or, in other words, by treatment with water. The water temperature may be, for example, 20 to 100° C., or in an embodiment, 25 to 80° C. The treatment with water may take 10 to 120 seconds, for example. The higher the water temperature, the less time step (4) takes. It is surprising that process step (4) can be performed simply with water and without a need to use any further auxiliary chemicals like, for example, acids or bases; this means a considerable advantage not only from an environmental but also from a safety point of view. Surprisingly, it is sufficient to submerge the n-type semiconductor substrate with the fired aluminum paste on its surface into water, although it is also possible to employ other ways of treatment with water, for example, rinsing, spraying or even water jet-spraying. The various methods of treatment with water can also be used in combination. Although there is no need to, it is possible to support the treatment with water by mechanical abrasion, for example, brushing or wiping.

After conclusion of step (4) an n-type semiconductor substrate having at least one aluminum p-doped surface region is obtained. Therefore, the invention relates also to the n-type semiconductor substrate having the at least one aluminum p-doped surface region made by the process of the invention.

While not wishing to be bound by any theory, it is surmised that the 3 to 20 wt. % of glass frit present in the aluminum paste give rise to that during firing all or at least a considerable part of aluminum oxide present on the surface of aluminum particles is consumed by the glass and that aluminum particles are left vulnerable to water attack. It is further surmised that the fired aluminum composition reacts with water resulting in fragility enabling its removal from the aluminum p-doped surface region which remains with the n-type semiconductor substrate.

In the preceding disclosure the invention has been described in its general embodiment. In the following, a particular embodiment of the invention is disclosed.

In the particular embodiment of the process of the invention, the n-type semiconductor substrate provided in step (1) is an n-type solar cell wafer, and the at least one surface area of the n-type semiconductor substrate on which the aluminum paste is applied in step (2) is/are one or more surface areas of the n-type solar cell wafer, wherein the one or more surface areas is/are to be provided with p-type emitter(s). Consequently, the process is then a process for the formation of at least one aluminum p-doped surface region in the form of one or more p-type emitters of the n-type solar cell wafer. Thus, in its particular embodiment, the invention relates to a process for the formation of one or more p-type emitters of an n-type solar cell wafer. Accordingly, it relates also to a process for the production of the n-type solar cell wafer itself which has the p-type emitter(s).

Therefore, in its particular embodiment, the process of the invention includes the steps:
(1') providing an n-type solar cell wafer,
(2') applying and drying an aluminum paste on one or more surface areas of the n-type solar cell wafer which is/are to be provided with p-type emitter(s),
(3') firing the applied and dried aluminum paste, and
(4') removing the fired aluminum paste with water,
wherein the aluminum paste employed in step (2') includes particulate aluminum, an organic vehicle and 3 to 20 wt. % of glass frit, based on total aluminum paste composition.

The n-type solar cell wafer provided in step (1') may, for example, be selected from the group consisting of n-type crystalline germanium solar cell wafers and n-type crystalline germanium-silicon alloy solar cell wafers. The n-type solar cell wafer may in particular be selected from the group consisting of n-type crystalline silicon solar cell wafers.

The production of n-type solar cell wafers is known to the person skilled in the art. Reference is made to the section above "Technical Background of the Invention", where the production of n-type solar cell wafers of the standard and of the MWT type is described.

The n-type solar cell wafer provided in step (1') has no p-type emitter and it is to be provided with one or more p-type emitters, for example, with a front p-type emitter or with a number of heterojunction p-type emitters located on the backside of the n-type solar cell wafer. In case of an n-type MWT solar cell wafer the front p-type emitter covers not only the front-side of the wafer but also the inside of its holes.

In step (2') the aluminum paste is applied on one or more surface areas of the n-type solar cell wafer provided in step (1'). The one or more surface areas is that/are those which is/are to be provided with a p-type emitter, i.e. that/those where a p-type emitter is to be formed. The aluminum paste is the same as that used in step (2) of the process of the invention in its general embodiment; to avoid unnecessary repetitions, reference is made to the corresponding disclosure above.

The aluminum paste is applied to a dry film thickness of, for example, 15 to 60 μm. The method of aluminum paste application may be printing, for example, silicone pad printing or, in an embodiment, screen printing. The application viscosity of the aluminum paste may be, for example, 20 to 200 Pa·s when it is measured at a spindle speed of 10 rpm and 25° C. by a utility cup using a Brookfield HBT viscometer and #14 spindle.

After its application the aluminum paste is dried, for example, for a period of 1 to 100 minutes with the solar cell wafer reaching a peak temperature in the range of 100 to 300° C. Drying can be carried out making use of, for example, belt, rotary or stationary driers, in particular, IR belt driers.

Then, in step (3'), the dried aluminum paste is fired. Firing may be performed, for example, for a period of 1 to 5 minutes with the n-type solar cell wafer reaching a peak temperature in the range of 700 to 900° C. Firing can be carried out making use of, for example, single or multi-zone belt furnaces, in particular, multi-zone IR belt furnaces. Firing happens in the presence of oxygen, in particular, in the presence of air. During firing the organic substance including non-volatile organic material and the organic portion not evaporated during the drying step may be removed, i.e. burned and/or carbonized, in particular, burned. The organic substance removed during firing includes organic solvent(s), possible organic polymer(s), possible organic additive(s) and the organic moieties of possible metal-organic compounds. There is a further process taking place during firing, namely sintering of the glass frit. During firing the temperature exceeds the melting point of aluminum; in the typical case of an n-type silicon solar cell wafer an aluminum-silicon melt is formed and, subsequently, during the cooling phase, an epitaxially grown layer of silicon is formed that is p-doped with aluminum, namely a p-type-emitter.

Typically, there is no remarkable delay between performing process steps (3') and (4'), in particular not when the process of the invention in its particular embodiment is carried out as an industrial process. For example, process step (4') will typically be carried out immediately after or, for example, within 24 hours after the n-type solar cell wafer has cooled down after conclusion of process step (3'). However, the length of time between performing process steps (3') and (4') is not critical and has no influence on a successful performance of the particular embodiment of the process of the invention.

In step (4') the fired aluminum composition is removed with water. To avoid unnecessary repetitions reference is made to the disclosure in connection with the description of step (4) of the general embodiment of the process of the invention.

After conclusion of step (4') an n-type solar cell wafer having one or more p-type emitters is obtained. Therefore, the invention relates also to said n-type solar cell wafer made by the process of the invention in its particular embodiment.

While not wishing to be bound by any theory, it is surmised that the 3 to 20 wt. % of glass frit present in the aluminum paste give rise to that during firing all or at least a considerable part of aluminum oxide present on the surface of aluminum particles is consumed by the glass and that aluminum particles are left vulnerable to water attack. It is further surmised that the fired aluminum composition reacts with water resulting in fragility enabling its removal from the aluminum-p-doped surface region(s), i.e. the p-type emitter(s), which remain(s) with the n-type solar cell wafer.

The n-type solar cell wafer having the p-type emitter(s) so obtained can then be further processed, i.e. provided with an ARC layer and with any necessary conductive metallizations.

What is claimed is:

1. A process for the formation of at least one aluminum p-doped surface region of an n-type semiconductor substrate comprising the steps:
    (1) providing an n-type semiconductor substrate,
    (2) applying and drying an aluminum paste on at least one surface area of the n-type semiconductor substrate,
    (3) firing the dried aluminum paste, and (4) removing the fired aluminum paste with water, wherein the aluminum paste employed in step (2) includes particulate aluminum, an organic vehicle and 3 to 20 wt. % of glass frit, based on total aluminum paste composition, wherein the firing of step (3) is carried out in a belt furnace for a period of 1 to 5 minutes with the wafer reaching a peak temperature in the range of 700 to 900° C.

2. The process of claim 1, wherein the n-type semiconductor substrate is selected from the group consisting of semiconductor substrates of n-doped crystalline germanium, semiconductor substrates of n-doped crystalline germanium-silicon alloy and semiconductor substrates of n-doped crystalline silicon.

3. The process of claim 1, wherein the n-type semiconductor substrate is an n-type solar cell wafer, wherein the at least one surface area of the n-type semiconductor substrate is/are one or more surface areas of the n-type solar cell wafer, and wherein the one or more surface areas of the n-type solar cell wafer is that/are those to be provided with a p-type emitter.

4. The process of claim 3, wherein the n-type solar cell wafer is selected from the group consisting of n-type crystalline germanium solar cell wafers, n-type crystalline germanium-silicon alloy solar cell wafers and n-type crystalline silicon solar cell wafers.

5. The process of claim 1, wherein the particulate aluminum is present in the aluminum paste in a proportion of 50 to 80 wt. %, based on total aluminum paste composition.

6. The process of claim 1, wherein the glass frit is an aluminosilicate glass or a borosilicate glass.

7. The process of claim 1, wherein the organic vehicle content in the aluminum paste is 20 to 45 wt. %, based on total aluminum paste composition.

8. An n-type semiconductor substrate having at least one aluminum p-doped surface region made by the process of claim 1, wherein the aluminum p-doped surface region penetrates the surface in the respective area only to a certain penetration depth in the range of, 500 to 4000 nm, in particular, 3000 to 4000 nm, forming the aluminum p-doped surface region in the respective area, wherein the aluminum p-doped region does not penetrated throughout the entire semiconductor substrate.

9. The process of claim 3, wherein the particulate aluminum is present in the aluminum paste in a proportion of 50 to 80 wt. %, based on total aluminum paste composition.

10. The process of claim 3, wherein the glass frit is an aluminosilicate glass or a borosilicate glass.

11. The process of claim 3, wherein the organic vehicle content in the aluminum paste is 20 to 45 wt. %, based on total aluminum paste composition.

12. An n-type solar cell wafer having one or more p-type emitters made by the process of claim 3.

* * * * *